(12) United States Patent
Park

(10) Patent No.: US 7,371,665 B2
(45) Date of Patent: May 13, 2008

(54) METHOD FOR FABRICATING SHALLOW TRENCH ISOLATION LAYER OF SEMICONDUCTOR DEVICE

(75) Inventor: Dong Hoon Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/176,083

(22) Filed: Jul. 7, 2005

(65) Prior Publication Data

US 2006/0008971 A1    Jan. 12, 2006

(30) Foreign Application Priority Data

Jul. 7, 2004    (KR) ............... 10-2004-0052613

(51) Int. Cl.
*H01L 21/20*    (2006.01)
*H01L 21/36*    (2006.01)

(52) U.S. Cl. .............. 438/488; 438/479; 438/584; 438/633; 257/E21.09; 257/E21.092; 257/E21.102

(58) Field of Classification Search .......... 438/584, 438/633, 478, FOR. 393, 479, 488
See application file for complete search history.

(56) References Cited

U.S. PATENT DOCUMENTS 6,200,866 B1 * 3/2001 Ma et al. ............... 438/299
2002/0011629 A1 * 1/2002 Chan et al. ............ 257/368
2005/0001273 A1 * 1/2005 Bryant et al. .......... 257/369
2005/0090066 A1 * 4/2005 Zhu et al. .............. 438/300
2005/0133830 A1 * 6/2005 Diaz et al. ............. 257/288
2005/0136588 A1 * 6/2005 Speyer ................... 438/221
2005/0170659 A1 * 8/2005 Hanafi et al. .......... 438/723

* cited by examiner

*Primary Examiner*—Michelle Estrada
(74) *Attorney, Agent, or Firm*—Andrew D. Fortney

(57) ABSTRACT

A method for fabricating an STI layer of a semiconductor device is disclosed, to improve the integration of the semiconductor device in a method of increasing a moat area for a gate line by minimizing an isolation area between moat areas, which includes the steps of forming a sacrificial layer on a substrate; forming a moat pattern by coating a photoresist on the sacrificial layer and performing exposure and development process to the coated photoresist with a mask pattern of the STI layer; patterning the sacrificial layer by using the moat pattern as a mask; forming an insulating layer on an entire surface of the substrate including the patterned sacrificial layer after removing the moat pattern; forming insulating layer sidewalls at the side of the sacrificial layer by anisotropically etching the insulating layer; removing the sacrificial layer and forming a silicon layer on the substrate; and planarizing the surface of the silicon layer and the insulating layer sidewalls by CMP.

18 Claims, 7 Drawing Sheets

METHOD FOR FABRICATING SHALLOW TRENCH ISOLATION LAYER OF SEMICONDUCTOR DEVICE

CROSS-REFERENCE TO RELATED APPLICATIONS

This application claims the benefit of Korean Application No. P2004-52613 filed on Jul. 7, 2004, which is hereby incorporated by reference as if fully set forth herein.

BACKGROUND OF THE INVENTION

1. Field of the Invention

The present invention relates to a method for fabricating a semiconductor device, and more particularly, to a method for fabricating a shallow trench isolation (STI) layer of a semiconductor device for isolation of high-integration semiconductor device.

2. Discussion of the Related Art

With development in the technology for fabricating a semiconductor device and the increase of the applied field of semiconductor device, there is the active research and study for obtaining high integration of the semiconductor device. As the integration of the semiconductor device increases, various methods for obtaining the minuteness in the semiconductor device are developed and researched. On the technology for the minuteness of the semiconductor device, it is necessary to decrease a device isolation layer in width, thereby obtaining the high-integration semiconductor device.

For example, an LOCOS (LOCal Oxidation of Silicon) technology may be used to obtain the high-integration semiconductor device. In the LOCOS technology, a device isolation layer is formed by selectively growing a thick oxide layer on a semiconductor substrate. In this case, the oxide layer may be formed in the undesired portions, whereby it has the limitation on the decrease of the width of the device isolation layer. However, in case of the semiconductor device below submicron, it is impossible to apply the LOCOS technology.

Thus, an STI (Shallow Trench Isolation) technology is developed, wherein a shallow trench is formed in a semiconductor substrate by etching, and the shallow trench is buried with an insulating material. In case of the STI technology, it is possible to decrease a device isolation area.

Hereinafter, a method for fabricating an STI layer of a semiconductor device according to the related art will be described with reference to the accompanying drawings. FIG. 1A to FIG. 1G are cross sectional views of the process for fabricating an STI layer of a semiconductor device according to the related art.

As shown in FIG. 1A, a pad oxide layer $SiO_2$ 12 is formed on a silicon substrate 10 of a semiconductor substrate by the thermal oxidation process, wherein the pad oxide layer 12 functions as a buffer. At this time, the pad oxide layer 12 is formed at a thickness of 100 Å to 200 Å. Then, a silicon nitride layer $Si_3N_4$ 14 is formed on the pad oxide layer 12 at a thickness of 1000 Å to 2000 Å, wherein the silicon nitride layer 14 functions as a hard mask layer.

Referring to FIG. 1B, a moat pattern 16 is formed on the hard mask layer 14, wherein the moat pattern 16 is provided to define an active area and a shallow trench isolation area in the semiconductor device. At this time, a photoresist is coated on the hard mask layer 14, and the exposure and development process is performed to the coated photoresist in state of using a mask pattern of an STI layer, thereby forming the moat pattern 16.

As shown in FIG. 1C, the hard mask layer 14 and the pad oxide layer 12 are patterned in the dry-etching process of using the moat pattern 16. In case of the dry-etching process of the hard mask layer 14, the hard mask layer 14 is dry-etched by plasma in the atmosphere of Ar gas with reaction gas of $CHF_3$ and $O_2$ inside an etching apparatus of an MERIE (Magnetically Enhanced Reactive Ion Etching) method. In this etching process, $CHF_3$ gas is provided at 40 sccm to 80 sccm, $O_2$ gas is provided at 0 sccm to 20 sccm, and Ar gas is provided 6 sccm to 120 sccm. Also, the etching apparatus of MERIE method is maintained at a pressure of 20 mTorr to 70 mTorr, and RF power is maintained at 200 W to 300 W.

As shown in FIG. 1D, the semiconductor substrate 10 exposed by the hard mask layer 14 and the pad oxide layer 12 is dry-etched at the predetermined depth, for example, about 3000 Å to 5000 Å. After forming a shallow trench 18 for fabrication of the STI layer, the moat pattern 16 is removed.

Although not shown, a linear insulating layer of silicon oxide $SiO_2$ is thinly formed on the inner surface of the shallow trench 18, and the side of the pad oxide layer 12 and the hard mask layer 14.

Referring to FIG. 1E, a gap-fill insulating layer 20 of silicon oxide $SiO_2$ or TEOS is formed to fill the shallow trench.

As shown in FIG. 1F, the gap-fill insulating layer 20 and the linear insulating layer are etched by CMP (Chemical Mechanical Polishing) until exposing the hard mask layer 14, thereby planarizing the surface of the gap-fill insulating layer 20 and the linear insulating layer. The reference number 20a indicates the gap-fill insulating layer after the planarization process.

In FIG. 1G, the hard mask layer 14 is removed with phosphoric acid. Then, the pad oxide layer 12 is partially removed by cleaning, thereby completing the STI layer 20a according to the related art.

In the process for fabricating the STI layer according to the related art, the STI layer of the insulating area is formed by performing the moat pattern formation and etching process after forming the pad oxide layer and the nitride layer.

However, the method for fabricating the semiconductor device according to the related art has the following disadvantages.

In the method for fabricating the semiconductor device according to the related art, it is impossible to obtain the STI layer critical dimension CD below the predetermined value due to the limitation of the related art. That is, the integration of the semiconductor device may be deteriorated since the area of the moat pattern for forming a gate line is decreased.

SUMMARY OF THE INVENTION

Accordingly, the present invention is directed to a method for fabricating an STI layer of a semiconductor device that substantially obviates one or more problems due to limitations and disadvantages of the related art.

An object of the present invention is to provide a method for fabricating an STI layer of a semiconductor device to improve the integration of the semiconductor device in a method of increasing a moat area for a gate line by minimizing an isolation area between moat areas.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating an STI layer of a semiconductor device includes the steps of forming a sacrificial layer on a substrate; forming a moat pattern by coating a photoresist on the sacrificial layer and performing exposure and development process to the coated photoresist with a mask pattern of the STI layer; patterning the sacrificial layer by using the moat pattern as a mask; forming an insulating layer on an entire surface of the substrate including the patterned sacrificial layer after removing the moat pattern; forming insulating layer sidewalls at the side of the sacrificial layer by anisotropically etching the insulating layer; removing the sacrificial layer and forming a silicon layer on the substrate; and planarizing the surface of the silicon layer and the insulating layer sidewalls by CMP.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a shallow trench isolation layer in a semiconductor device according to the present invention will be described with reference to the accompanying drawings.

FIG. 2A to FIG. 2G are cross sectional views of the process for trench isolation in a semiconductor device according to the present invention.

Figure 1A:
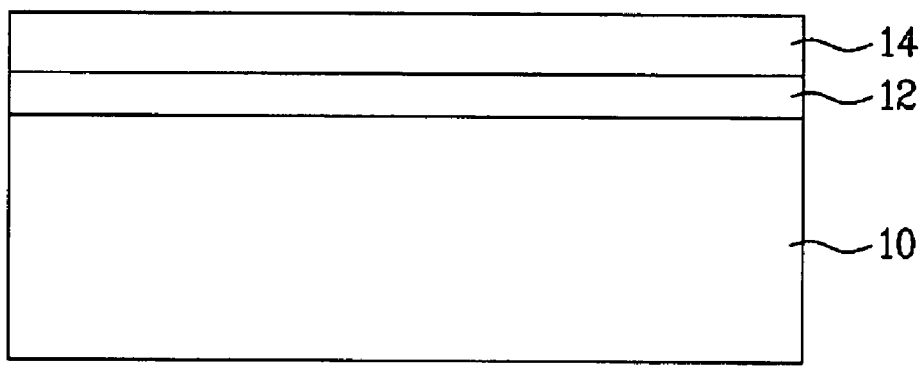
FIG. 1A to FIG. 1G are cross sectional views of the process for trench isolation in a semiconductor device according to the related art.
Figure 1B:
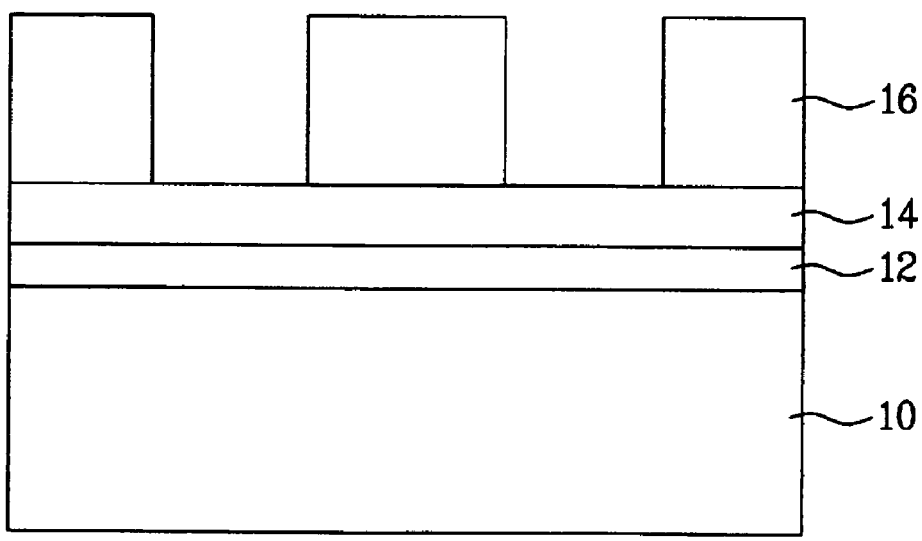
Figure 1C:
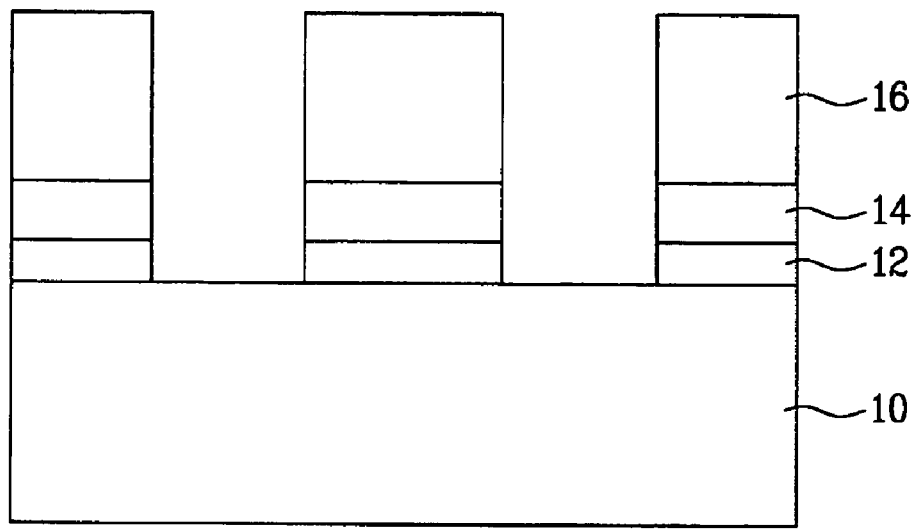
Figure 1D:
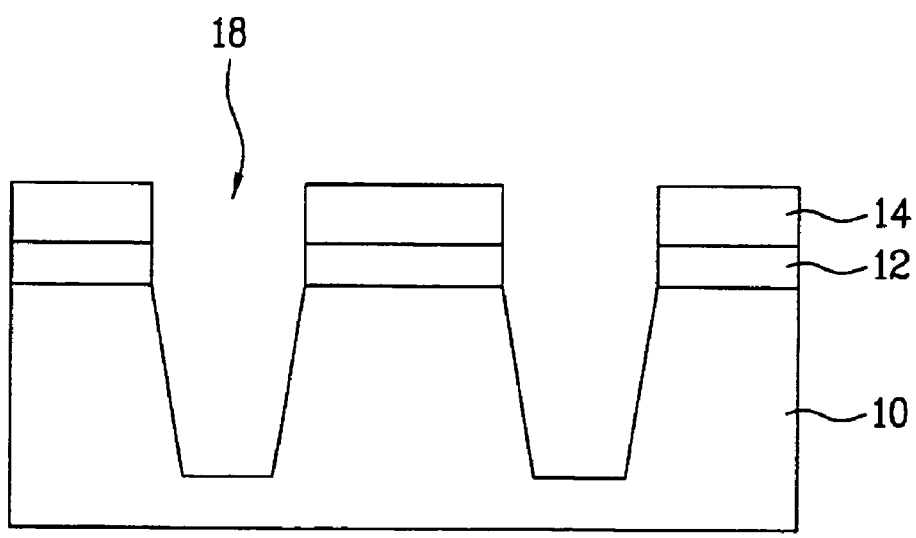
Figure 1E:
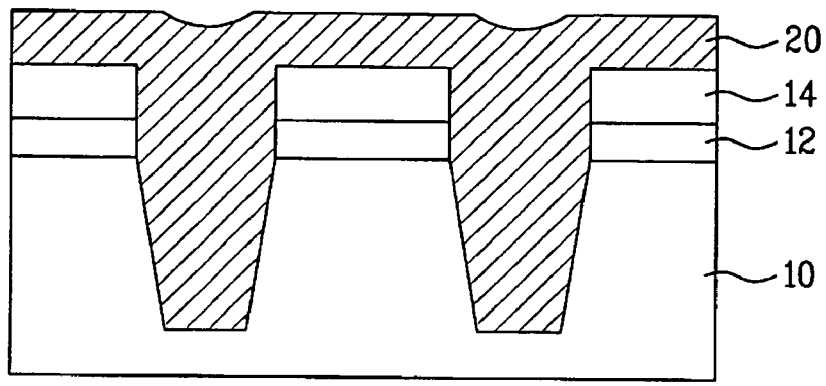
Figure 1F:
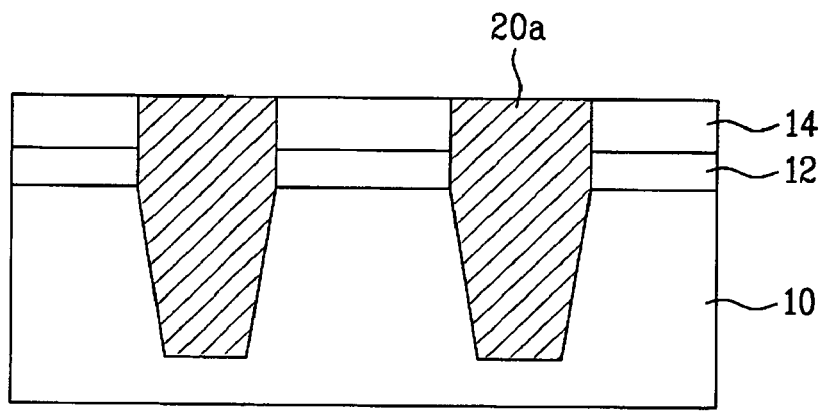
Figure 1G:
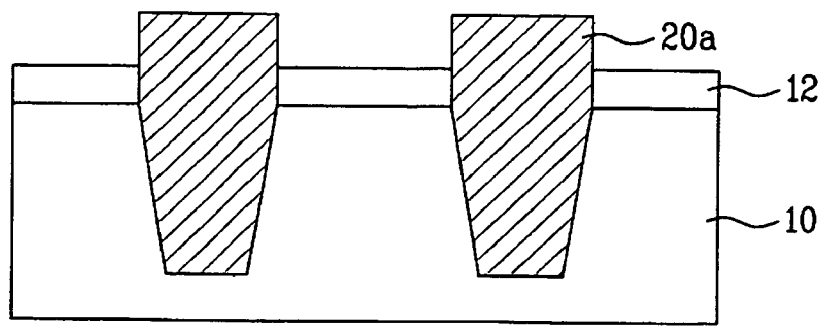
Figure 2A:
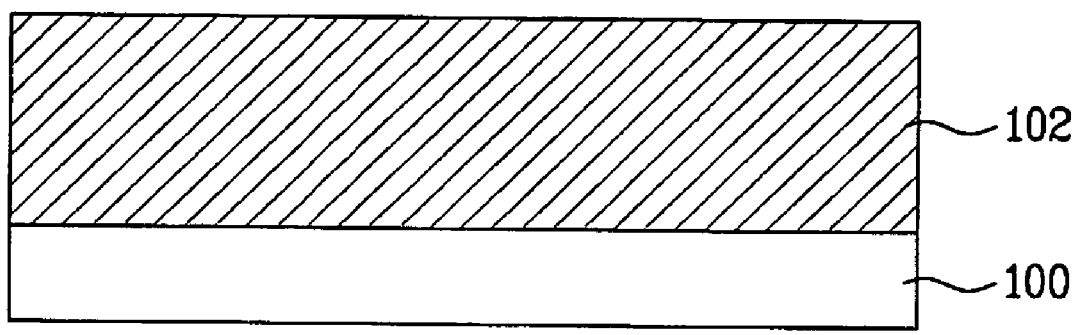
FIG. 2A to FIG. 2G are cross sectional views of the process for trench isolation in a semiconductor device according to the present invention.

First, as shown in FIG. 2A, a polysilicon 102 is formed on a silicon substrate 100 of a semiconductor substrate, wherein the polysilicon 102 is deposited at a thickness of 1000 Å to 2000 Å. At this time, the polysilicon 102 is deposited in state of exposing the silicon substrate 100, so as to improve gate integration by minimizing a moat isolation area between moat areas. Instead of the polysilicon, an insulating layer (for example, oxide layer) may be used, wherein the insulating layer is greater in an etching select ratio than a nitride layer.

Figure 2B:
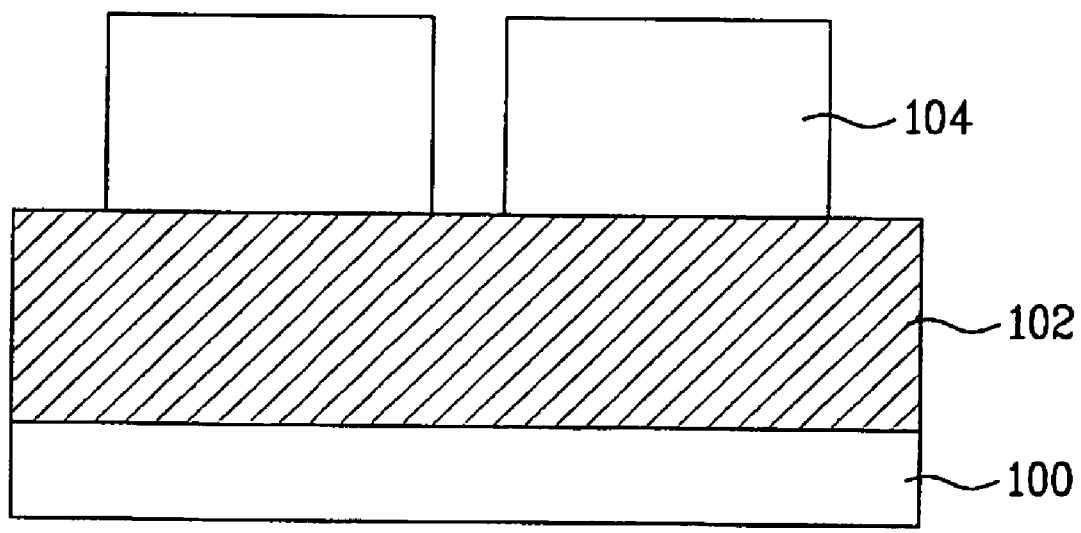

As shown in FIG. 2B, a moat pattern 104 is formed on the polysilicon 102, wherein the moat pattern 104 is provided to define an active area and a shallow trench isolation area. To form the moat pattern 104, a photoresist is coated on the polysilicon 102, and then the exposure and development process is performed to the photoresist with a mask pattern of an STI layer.

At this time, the mask for patterning the STI layer is different from a related art mask. That is, the related art mask has a light-shielding layer corresponding to the active area, and a light-transmitting layer corresponding to a field area. In case of the mask according to the present invention, the portion of the field area corresponds to the edge of the moat pattern 104. Accordingly, the field area is not defined by the predetermined portion from which the photoresist is removed. That is, the portion from which the photoresist is removed also corresponds to the active area. The field area is defined with the boundary between the portion from which the photoresist is removed and the portion which the photoresist remains.

Figure 2C:
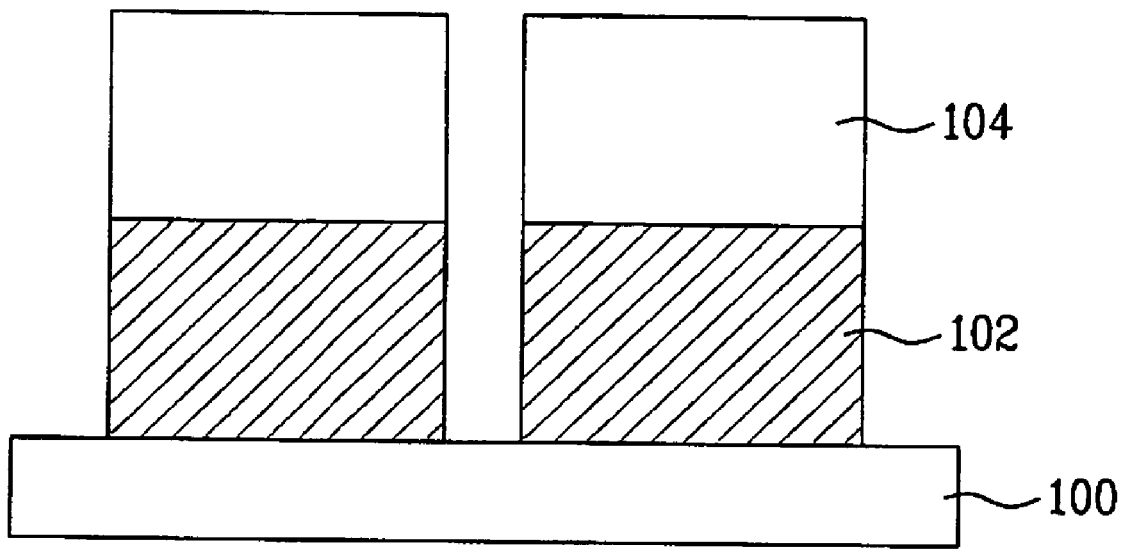
Figure 2D:
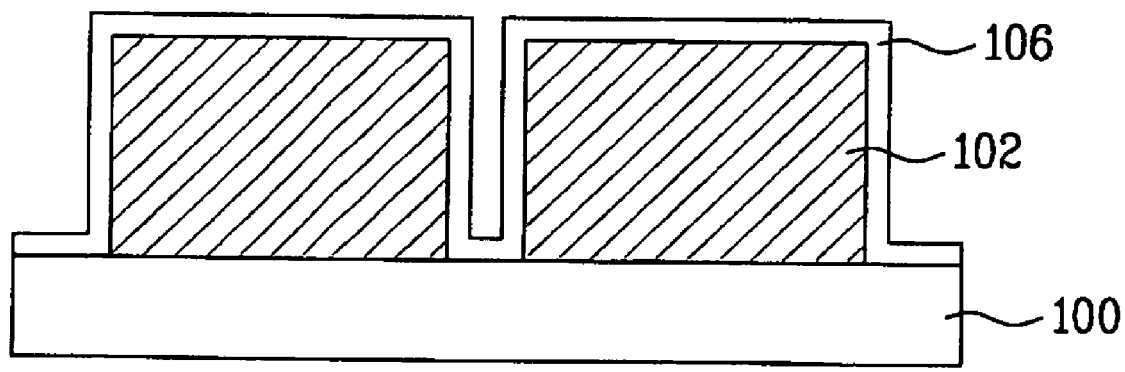

As shown in FIG. 2C, the polysilicon 102 is patterned and etched in the dry-etching process of using the moat pattern 104. Next, as shown in FIG. 2D, after removing the patterned and etched moat pattern 104, a nitride layer is deposited on the entire surface of the silicon substrate including the patterned polysilicon 102.

Figure 2E:
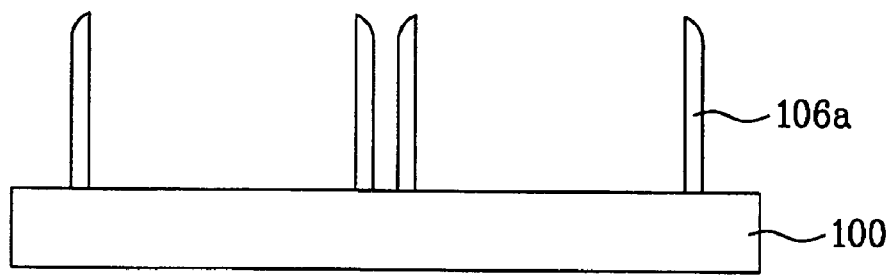

As shown in FIG. 2E, nitride layer sidewalls 106a are formed by anisotropically etching the nitride layer 106. Then, the polysilicon 102 is removed to remain only the nitride layer sidewalls 106a.

Figure 3:
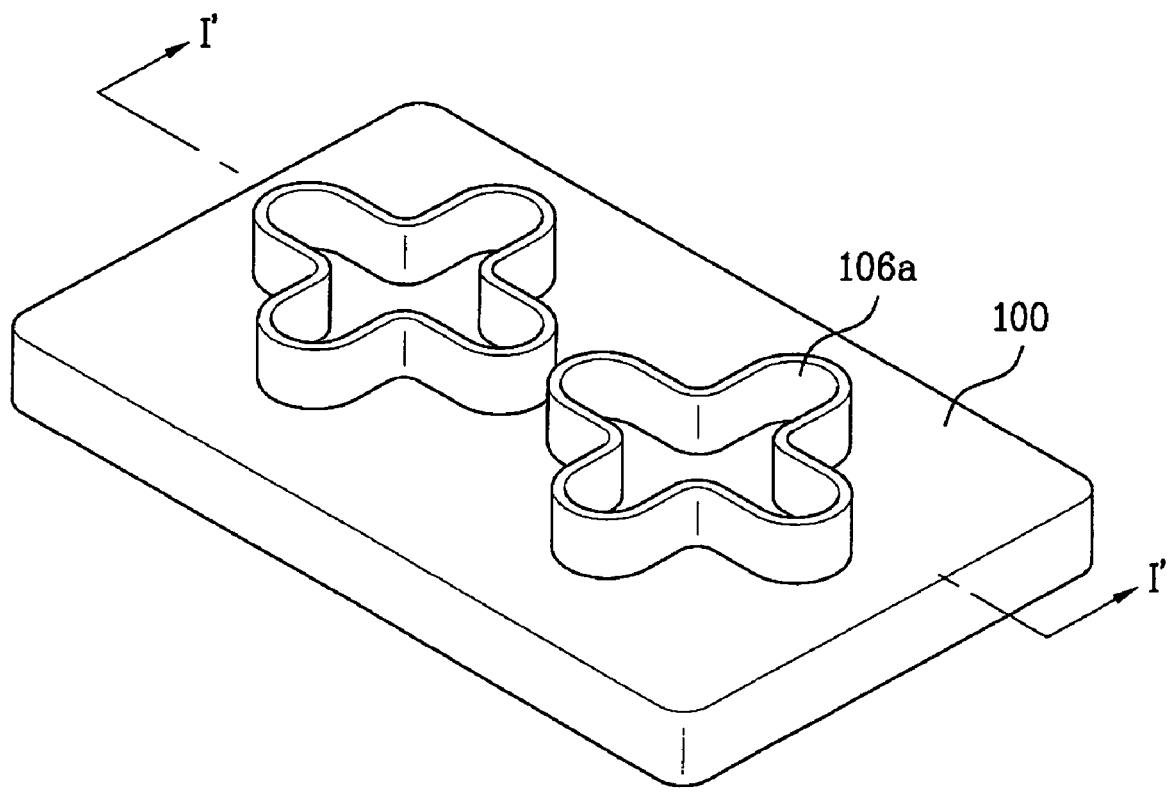
FIG. 3 is a perspective view of FIG. 2E.

FIG. 2E is a cross sectional view along A-A' of FIG. 3.

Figure 2F:
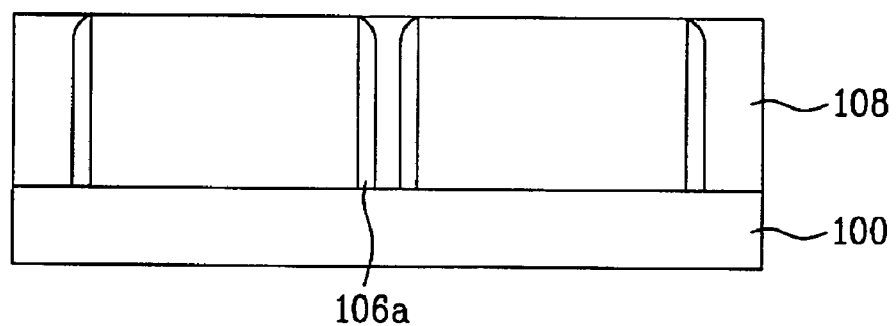
Figure 2G:
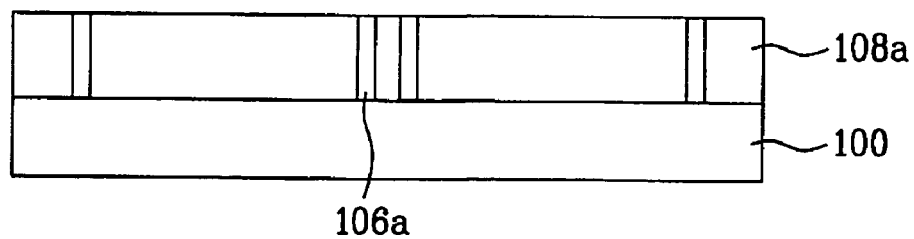

As shown in FIG. 2F, a silicon Si layer 108 is formed on the silicon substrate 100 by epitaxial growth. Then, the silicon layer 108 and the nitride layer sidewalls 106a are etched by CMP (Chemical Mechanical Polishing), thereby forming the planarized silicon layer 108a. As a result, the isolation area of the nitride layer having the minimum critical dimension is formed between the moat areas.

As mentioned above, the method for fabricating the semiconductor device according to the present invention has the following advantages.

In the method for fabricating the semiconductor device according to the present invention, the isolation area of the minimum critical dimension CD is formed between the moat areas, so that it is possible to improve the integration of device by increasing the moat areas.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an isolation layer of a semiconductor device comprising:

forming a sacrificial layer on a substrate;

forming a moat pattern which defines an active area and an isolation area by coating a photoresist on the sacrificial layer and performing an exposure and development process to the coated photoresist;

patterning the sacrificial layer by using the moat pattern as a mask;

forming an insulating layer on an entire surface of the substrate including the patterned sacrificial layer after removing the moat pattern;

forming spacers at the sidewalls of the patterned sacrificial layer by anisotropically etching the insulating layer;

removing the patterned sacrificial layer and exposing an entire surface of the substrate except for areas of the substrate under the spacers;

depositing a silicon layer on an entire surface of the substrate including the spacers, wherein the silicon layer is deposited on both an inside and an outside of each of the spacers at the same time; and planarizing the surface of the silicon layer and the spacers by CMP.

2. The method of claim 1, wherein the sacrificial layer comprises polysilicon.

3. The method of claim 1, wherein the sacrificial layer comprises an insulating material having a greater etching select ratio than the insulating layer.

4. The method of claim 1, wherein the insulating layer comprises an STI layer.

5. The method of claim 1, wherein the sacrificial layer has a thickness of 1000-2000 Å.

6. The method of claim 1, wherein the insulating layer comprises a nitride layer.

7. The method of claim 1, wherein the sacrificial layer comprises an oxide layer.

8. The method of claim 1, wherein patterning the sacrificial layer comprises a dry etch process.

9. The method of claim 1, wherein depositing the silicon layer comprises epitaxial growth.

10. A method for fabricating an isolation layer of a semiconductor device comprising:

forming a sacrificial layer comprising an insulating material on a substrate;

patterning the sacrificial layer to define an active area and an isolation area;

forming an insulating layer with a lesser etching select ratio than the insulating material on an entire surface of the substrate including the patterned sacrificial layer;

forming spacers at the sidewalls of the patterned sacrificial layer by anisotropically etching the insulating layer;

removing the patterned sacrificial layer and exposing an entire surface of the substrate except for areas of the substrate under the spacers;

epitaxially growing a silicon layer on the substrate in contact with the spacers, wherein the silicon layer is epitaxially grown on both an inside and an outside of each of the spacers at the same time; and planarizing the silicon layer and the spacers by CMP.

11. The method of claim 10, wherein the sacrificial layer comprises polysilicon.

12. The method of claim 10, wherein planarizing the silicon layer and the spacers forms a coplanar upper surface on the silicon layer and the spacers.

13. The method of claim 10, wherein the sacrificial layer is deposited to a thickness of 1000-2000 Å.

14. The method of claim 10, wherein the insulating layer comprises a nitride layer.

15. The method of claim 10, wherein the sacrificial layer comprises an oxide layer.

16. The method of claim 10, further comprising forming a moat pattern by coating a photoresist on the sacrificial layer and performing an exposure and development process on the coated photoresist before patterning the sacrificial layer.

17. The method of claim 16, wherein patterning the sacrificial layer comprises a dry etch process.

18. The method of claim 1, wherein the distance between the spacers defines a critical dimension of a Shallow Trench Isolation structure.

* * * * *